(12) United States Patent
Graf (10) Patent No.: US 6,995,555 B2
(45) Date of Patent: Feb. 7, 2006

(54) APPARATUS AND METHOD FOR DETERMINING A CURRENT THROUGH A POWER SEMICONDUCTOR COMPONENT

(75) Inventor: Alfons Graf, Kaufering (DE)

(73) Assignee: Infineon Technologies AG, Munich (DE)

( * ) Notice: Subject to any disclaimer, the term of this patent is extended or adjusted under 35 U.S.C. 154(b) by 50 days.

(21) Appl. No.: 10/134,010

(22) Filed: Apr. 26, 2002

(65) Prior Publication Data

US 2002/0158654 A1 Oct. 31, 2002

(30) Foreign Application Priority Data

Apr. 26, 2001 (DE) .......................................... 101 20 524

(51) Int. Cl.
*G01R 19/00* (2006.01)
*G01R 31/28* (2006.01)

(52) U.S. Cl. ........................................ 324/126; 324/765
(58) Field of Classification Search ................ 324/126, 324/712, 713, 715, 754, 765, 768, 769; 363/97; 338/49
See application file for complete search history.

(56) References Cited

U.S. PATENT DOCUMENTS

| | | | | |
|---|---|---|---|---|
| 3,617,870 A | * | 11/1971 | Howes | ........................ 324/402 |
| 4,179,652 A | * | 12/1979 | Davis | ........................ 324/715 |
| 4,584,525 A | * | 4/1986 | Harnden et al. | ............ 324/126 |
| 4,599,554 A | | 7/1986 | Jaycox et al. | ................ 323/317 |
| 5,101,334 A | * | 3/1992 | Plagge et al. | .................. 363/19 |
| 6,014,059 A | * | 1/2000 | Nordwall | ..................... 330/289 |
| 6,437,607 B1 | * | 8/2002 | Milanesi | ...................... 327/90 |

FOREIGN PATENT DOCUMENTS

EP    0 942 524 A2    9/1999

OTHER PUBLICATIONS

Lappe, R. et al.: "Leistungselektronik–Meβtechnik" [Power Electronics Measurement Technique], VEB Verlag Technik Berlin, vol. 1, (month unavailable) 1982, pp. 120–121.

* cited by examiner

*Primary Examiner*—Ernest Karlsen
(74) *Attorney, Agent, or Firm*—Laurence A. Greenberg; Werner H. Stemer; Ralph E. Locher (57) ABSTRACT

A circuit configuration includes a power switch and a measuring configuration for detecting the load current through the power switch. The circuit configuration utilizes a voltage drop across a connecting line, in particular a bonding wire, which is connected in series with the power switch for the purpose of determining the load current. A method for determining a current through a power semiconductor component is also provided.

10 Claims, 10 Drawing Sheets

APPARATUS AND METHOD FOR DETERMINING A CURRENT THROUGH A POWER SEMICONDUCTOR COMPONENT

BACKGROUND OF THE INVENTION

FIELD OF THE INVENTION

The invention relates to a circuit configuration having a power semiconductor component and an apparatus for determining a current through the power semiconductor component.

Figure 1:
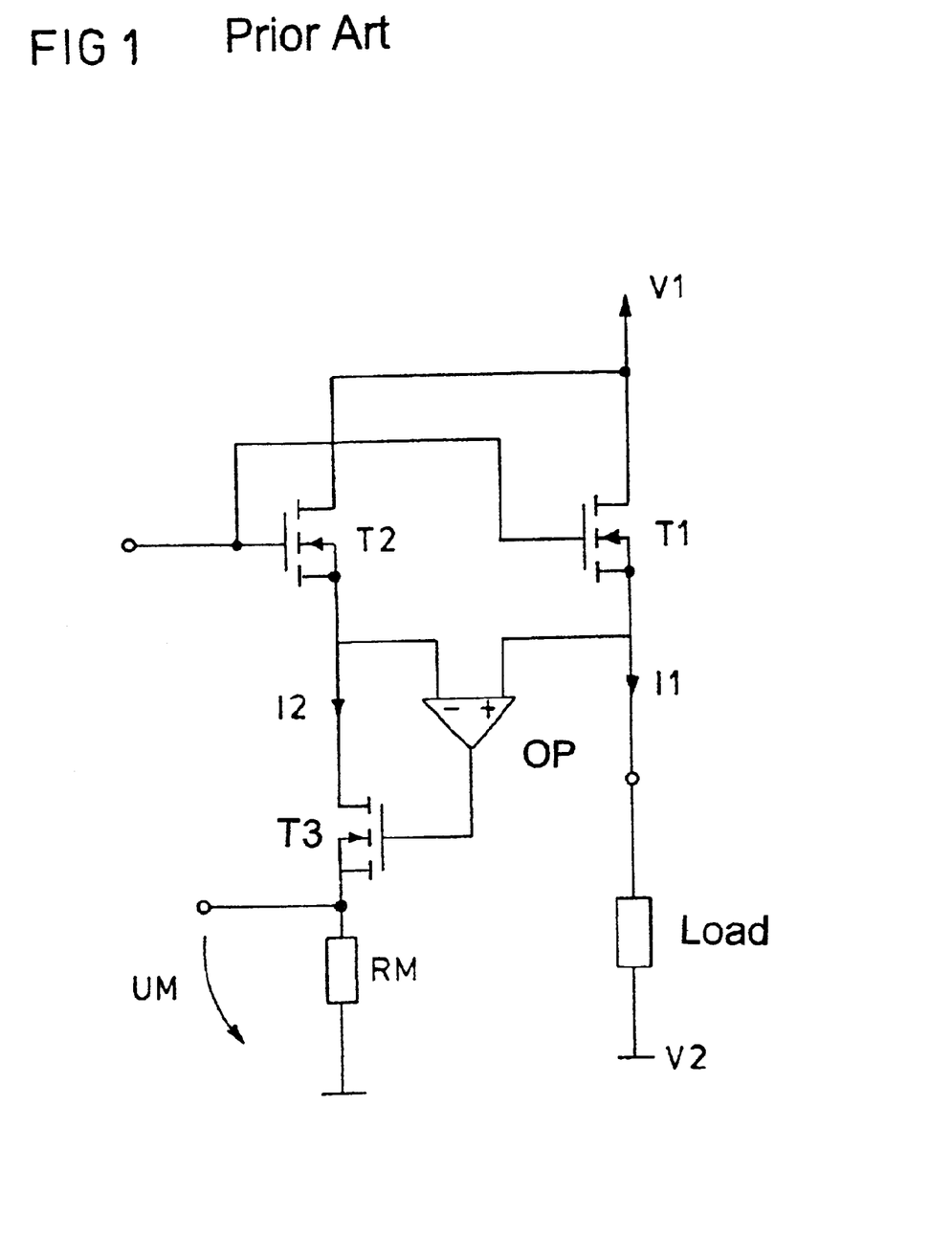
FIG. 1 is a circuit diagram of a conventional circuit configuration having a current measuring configuration operating according to the current sense principle.

FIG. 1 shows a conventional circuit configuration having a power semiconductor component which is configured as a power switch and is connected in series with a load, and having a current measuring configuration operating according to the so-called current sense principle. The power switch T1, configured as an n-channel power MOSFET (Metal Oxide Semiconductor Field Effect Transistor) in FIG. 1, is connected in series with a load between a first and a second supply potential V1, V2. In order to detect a load current I1 through power switch T1, a second transistor T2 is provided, which is operated at the same operating point as the power MOSFET T1. In order to set the same operating points, the gate connections of the two transistors T1, T2 are connected to one another and their drain connections are likewise connected to one another. In addition, a regulating circuit having an operational amplifier OP and a third transistor T2 connected in series with the second transistor T2 is connected downstream of the source connection of the second transistor T2. Inputs of the operational amplifier OP are connected to the source connections of the power transistor and of the second transistor T2, the operational amplifier OP setting the third transistor T3, which acts as a controllable resistor, in such a way that the source potential of the second transistor T2 corresponds to the source potential of the power transistor T1. A current I2 flowing through the second transistor T2 is then proportional to the load current I1. During the T1 production of the two transistors T1, T2 within the same production process, the proportionality factor corresponds to the ratio between the active transistor areas of the first and second transistors T1, T2.

A measurement voltage UM can be tapped off across a resistor RM connected in series with the second and third transistors T2, T3, through which resistor the measurement current I2 flows. A connecting terminal of the resistor which is remote from the third transistor T3 is connected to the second supply potential V2, which is usually a reference potential, in particular ground, for an entire circuit configuration in which the circuit illustrated is realized. The current measurement signal can then be tapped off relative to the reference potential V2.

The power switch illustrated in FIG. 1 serves as a so-called high-side switch, that is to say as a switch which is connected between the positive supply potential V1, or the higher positive supply potential, and the load. The generally known measurement principle in accordance with FIG. 1 cannot be employed, or can only be employed with considerable additional outlay, if the power switch serves as low-side switch, that is to say if the load is connected between the positive supply potential and the power switch. The source potential of the power transistor then approximately corresponds to the reference potential. In order that the source potential of the second transistor T2 serving for current measurement is likewise set to the value of the reference potential, the measuring resistor would have to be connected to a potential which is smaller than the reference potential. The provision of such a potential, which would have to be negative if the reference potential is ground, is associated with a considerable outlay on circuitry.

Furthermore, the measurement principle in accordance with FIG. 1 cannot be employed, or can only be employed with considerable additional outlay, when the potential at the source connection of the power switch becomes greater than the potential at the drain connection thereof, that is to say greater than the first supply potential. In this case, it would likewise be necessary to make available at the source of the measuring transistor a potential which is greater than the first supply potential and which would have to be at least as large as a potential induced by the inductive load at the source of the first transistor.

SUMMARY OF THE INVENTION

It is accordingly an object of the invention to provide a circuit configuration having a power semiconductor component, in particular a power switch, and a measuring configuration for detecting a current through the power semiconductor component which overcomes the above-mentioned disadvantages of the heretofore-known circuit configurations of this general type and which is also suitable for detecting the current in the case of a power switch operated in the reverse direction or as a low-side switch, without additional supply potentials having to be provided.

With the foregoing and other objects in view there is provided, in accordance with the invention, a circuit configuration, including:

a power semiconductor component having load connections including a first load connection and a second load connection;

a connecting line connected between one of the load connections and one of a load and a terminal for a supply potential;

the connecting line defining a first node and a second node, the first node being common to one of the load connections and the connecting line, the second node being remote from the power semiconductor component; and a measuring configuration having a first terminal and a second terminal as input terminals, the first terminal of the measuring configuration being connected to the first node, the second terminal of the measuring configuration being connected to the second node of the connecting line.

According to another feature of the invention, the terminal for a supply potential supplies a first supply potential; and the measuring configuration has a third terminal for receiving a second supply potential.

According to yet another feature of the invention, the connecting line has a given resistance; the measuring configuration has a series circuit including a first resistor and a second resistor; the first resistor has a resistance, the given resistance of the connecting line and the resistance of the first resistor having a given ratio; the second resistor is a variable resistor; the terminal for a supply potential supplies a first supply potential; and the series circuit is connected between a second supply potential and the second terminal of the measuring configuration.

According to another feature of the invention, the measuring configuration has a series circuit including a first resistor and a second resistor; and the second resistor is a variable resistor with a resistance set in dependence of a potential difference between the first terminal of the measuring configuration and a node common to the first resistor and the second resistor.

According to yet another feature of the invention, the measuring configuration has a series circuit including a first resistor and a second resistor; the connecting line is a first connecting line; and a second connecting line is connected in series with the first resistor, the second connecting line has a resistance less than a resistance of the first resistor.

According to a further feature of the invention, the measuring configuration has a series circuit including a first resistor and a second resistor; and the second resistor is a variable resistor configured as a transistor.

Another embodiment according to the invention includes an operational amplifier having a first input, a second input and an output, the first input being connected to the first terminal of the measuring configuration, the second input being connected to a node common to the first resistor and the second resistor; and the second resistor having a control connection, the output of the operational amplifier being connected to the control connection of the second resistor.

According to another feature of the invention, the measuring configuration has a series circuit including a first resistor and a second resistor; and the measuring configuration includes a current mirror configuration which provides a current measurement signal dependent on a current through the first resistor.

According to another feature of the invention, the current mirror configuration provides the current measurement signal with reference to a reference potential.

According to yet another feature of the invention, the power semiconductor component is a diode.

According to a further feature of the invention, the power semiconductor component is a power transistor with a diode connected in parallel thereto.

With the objects of the invention in view there is also provided, a circuit configuration, including:

power switch having a control connection and load connections;

a connecting line connected between one of the load connections and one of a load and a terminal for a first supply potential; and a current measuring configuration having a first input terminal, a second input terminal and a third input terminal, the first input terminal of the current measuring configuration being connected to a node common to a first one of the load connections of the power switch and the connecting line, the second input terminal of the current measuring configuration being connected to a second one of the load connections of the power switch, the third input terminal receiving a second supply potential.

According to another feature of the invention, the power switch is a transistor; and a series circuit includes a measuring transistor and a variable resistor, the series circuit is connected between the second input terminal of the current measuring configuration and the third input terminal of the current measuring configuration.

According to yet another feature of the invention, a resistance of the variable resistor is set in dependence on a potential difference between the first input terminal of the current measuring configuration and a node common to the measuring transistor and the variable resistor.

Another embodiment according to the invention includes an operational amplifier having a first input, a second input and an output, the first input being connected to the first input terminal of the current measuring configuration, the second input being connected to a node common to the measuring transistor and the variable resistor; and the variable resistor having a control connection, the output of the operational amplifier being connected to the control connection of the variable resistor.

According to another feature of the invention, the variable resistor is a transistor.

According to another feature of the invention, the current measuring configuration has a current mirror configuration which provides a measurement signal dependent on a current through the measuring transistor.

According to another feature of the invention, the current mirror configuration provides the current measurement signal with reference to a reference potential.

According to yet another feature of the invention, the power switch is a diode.

According to a further feature of the invention, the power switch is a power transistor and a diode connected in parallel thereto.

With the objects of the invention in view there is also provided, a method for determining a current through a power semiconductor component, the method includes the steps of:

connecting the power semiconductor component in series with a connecting line; and determining the current through the power semiconductor component by evaluating a voltage across the connecting line.

The circuit configuration according to the invention has a power semiconductor component, in particular a power transistor, a diode or a parallel circuit including a power transistor and a freewheeling diode, with a first and a second load connection and a connecting line, the connecting line being connected between one of the load connections and a load or a terminal for a supply potential. The connecting line is, in particular, a bonding wire which connects one of the load connections of the semiconductor component, which is usually integrated in a semiconductor body, to a connecting pin of a housing in which the semiconductor body is accommodated. The semiconductor component can be connected to further circuit components of a circuit via the connecting pin.

In the circuit configuration according to the invention, a voltage drop across the connecting line, which is brought about by a load current flowing in the power switch, is used to determine the load current. Alternatively, the voltage drop across the connecting line serves as an additional auxiliary voltage. To that end, in a first embodiment of the invention, provision is made of a current measuring configuration having a first, a second and third input terminal, the first input terminal being connected to a node common to the one of the load connections of the power semiconductor component and the connecting line, and the second connecting terminal being connected to a node of the connecting line which is remote from the power semiconductor component.

In the current measuring configuration, the voltage drop between the first and second inputs of the current measuring configuration, that is to say the voltage drop across the connecting line, is determined. This voltage drop is proportional to the load current through the power semiconductor component, the line resistance of the connecting line corresponding to the proportionality factor. In the case of bonding wires, the line resistance is dependent on the diameter, length and material thereof. These parameters are usually known precisely, so that the line resistance can be determined comparatively exactly and is subject to only small fluctuations from bonding wire to bonding wire in the same production process on account of the exact and precisely reproducible production method. Moreover, it is possible, after the completion of the semiconductor component to carry out calibration of the bonding wire resistance or trimming of the bonding wire resistance with a known resistor.

In one embodiment of the invention, a series circuit including a resistor whose resistance is in a known ratio to the resistance of the connecting line/bonding wire is connected between the third connecting terminal, at which a supply potential is available, and the second connecting terminal, the resistance of the variable resistor being set in such a way that the voltage drop across the first resistor corresponds to the voltage drop across the connecting line. The current flowing through the second resistor is then related to the load current via the ratio of the resistances of the connecting line and first resistor.

The variable resistor is preferably configured as a transistor, an operational amplifier being provided for driving the transistor one input of which operational amplifier is connected to the first input terminal, the other input of which operational amplifier is connected to a node common to the first and second resistors, and the output of which operational amplifier drives the transistor. The use of the operational amplifier, which has a very low current consumption, enables the setting of the voltage across the second resistor in a manner dependent on the load current virtually without any corruption of the load current.

In a further circuit configuration according to the invention, the power semiconductor component is configured as a power transistor and a measuring transistor is provided in the current measuring configuration, the control connection of which measuring transistor is connected to the control connection of the power transistor and one load connection of which measuring transistor is connected to the corresponding load connection of the power transistor. In this circuit configuration according to the invention, a voltage present on the connecting line of the load transistor is utilized for setting the potential at the other load connection of the measuring transistor to the value of the potential at the other load connection of the load transistor, without an additional supply potential being necessary.

The present invention can be employed in particular in circuit configurations in which the power semiconductor component is configured as a transistor and is used as a high-side switch or as a low-side switch. However, the invention can also be used in connection with other semiconductor components which enable a current flow between two connecting terminals and which are integrated in a semiconductor body which is contact-connected through the use of a bonding wire.

Other features which are considered as characteristic for the invention are set forth in the appended claims.

Although the invention is illustrated and described herein as embodied in an apparatus and a method for determining the current through a power semiconductor component, it is nevertheless not intended to be limited to the details shown, since various modifications and structural changes may be made therein without departing from the spirit of the invention and within the scope and range of equivalents of the claims.

The construction and a method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
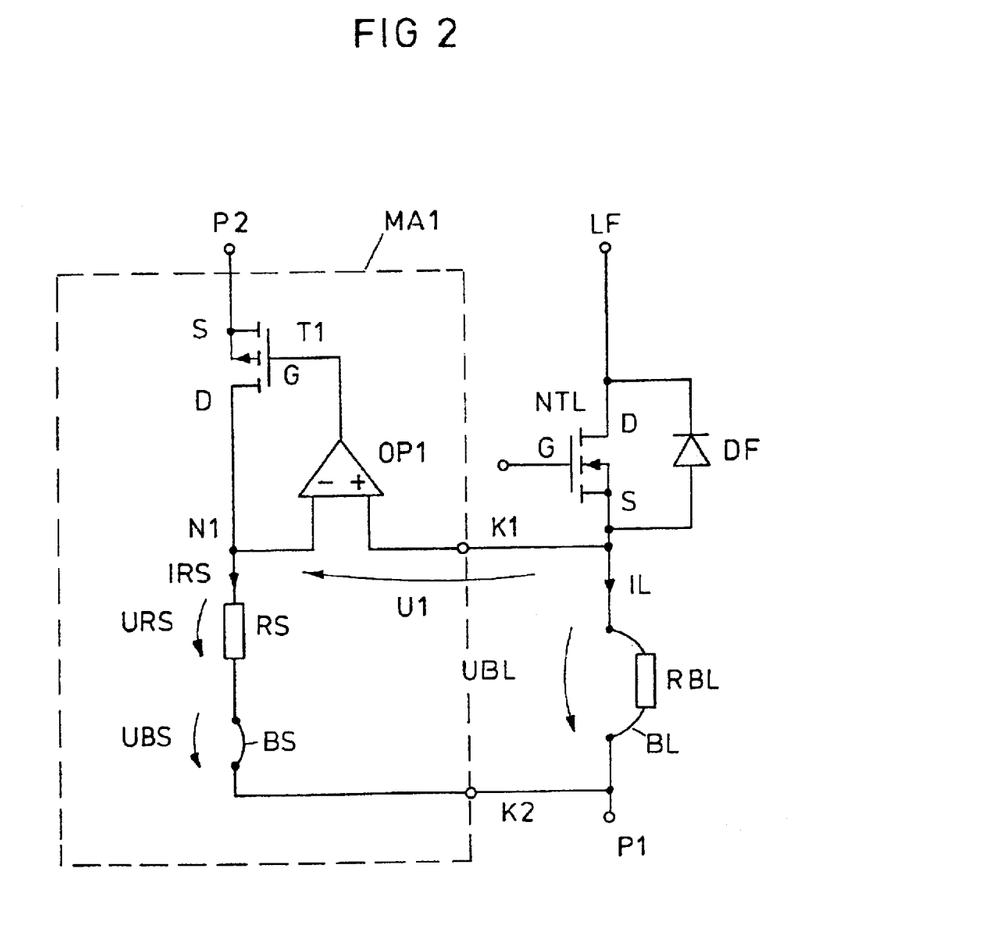
FIG. 2 is a circuit diagram of a circuit configuration according to the invention having a power semiconductor component, a connecting line connected in series with the power semiconductor component, and having a current measuring configuration in accordance with a first functional principle.

In the figures, unless specified otherwise, identical reference symbols designate identical or corresponding parts, currents and voltages. FIG. 2 shows a first exemplary embodiment of a circuit configuration according to the invention, which has a power switch which is configured as an n-channel field-effect transistor NTL and whose gate connection G forms a control connection, whose drain connection D forms a first load connection and whose source connection S forms a second load connection of the power switch. The drain-source path D-S of the transistor NTL is connected in series with a connecting line BL between a first connection LF and a second connection P1. The connecting line BL has a line resistance RBL, which is illustrated as an ohmic resistor RBL in FIG. 2. The connecting line BL is, in particular, a bonding wire which connects the source region of the transistor NTL integrated in a semiconductor body to a connecting pin of a housing (not illustrated) in which the semiconductor body with the power transistor NTL is accommodated. The connecting pin corresponds to the second connecting terminal P1 in FIG. 2. The drain region of a power transistor accommodated in a housing is usually connected directly to the lead frame of the housing. The first connecting terminal LF in FIG. 2 represents the lead frame of such a housing. If a load current IL flows through the power transistor NTL, then this load current IL brings about a voltage drop UBL across the connecting line BL, which voltage drop is evaluated in a current measuring configuration MA1 connected to the connecting line BL. A voltage drop across the connecting line BL is brought about irrespective of whether the load current IL, with the power transistor TL being driven, flows through the drain-source path D-S of the power transistor NTL in the direction depicted in FIG. 1 or whether the current flows in the opposite direction via a freewheeling diode DF, which is connected in parallel with the drain-source path D-S and which is integrated in the power transistor NTL. A voltage drop UBL across the connecting line BL is negative in the case of a current flow via the freewheeling diode DF, that is to say a current flow counter to the direction depicted.

The current measuring configuration MA1 has a first connecting terminal K1, which is connected to the source connection S of the power transistor NTL, or to the node common to the power transistor NTL and the connecting line BL. A second connecting terminal K2 is connected to that connection of the connecting line BL which is remote from the power transistor NTL. The current measuring configuration MA1 has a series circuit including a first resistor RS, whose resistance is in a known ratio to the resistance RBL of the connecting line BL, and a variable second resistor, which is configured as transistor T1 in FIG. 2. Moreover, in the exemplary embodiment, a second connecting line BS is provided, which, in particular, is likewise configured as a bonding wire and which connects the first resistor RS via the second connecting terminal K2 to the first connecting line BL, or the connecting pin P1. In the exemplary embodiment, the transistor Ti serving as variable resistor is configured as a p-channel transistor whose drain connection is connected to the first resistor RS and whose source connection S is connected to a third connecting terminal P2 of the current measuring configuration MA1. An operational amplifier OP1 is provided for driving the transistor T1, the noninverting input of which operational amplifier is connected to the first input terminal K1 and the inverting input of which operational amplifier is connected to the node N1 common to the resistor RS and the transistor T1. The operational amplifier OP1 sets the on resistance of the transistor T1 in such a way that a potential difference U1 between the first input terminal K1 and the common node N1 is zero, the sum of a voltage URS across the first resistor RS and a voltage UBS across the second connecting line BS then corresponding to the voltage UBL across the first connecting line BL. The value of the first resistor RS is preferably significantly greater than the resistance of the first connecting line RBL. The value of the first resistor RS is furthermore significantly greater than the resistance of the second connecting line BS, the voltage drop URS brought about by a current IRS through the first resistor RS then being significantly greater than the voltage drop UBS across the second connecting line BS, so that the voltage drop across the second connecting line BS can be disregarded. The voltage URS across the first resistor RS corresponds at least approximately to the voltage UBL on the connecting line BL, i.e.:

$$URS=UBL.$$

The following then holds true for the current IRS through the first resistor RS:

$$IRS=(RBL/RS)\cdot IL.$$

The current IRS through the first resistor is thus proportional to the load current IL, the proportionality factor corresponding to the known ratio of the resistances of the first resistor RS and the connecting line BL. Given a known resistance of the second bonding wire BS, which can likewise be determined from the parameters such as length, diameter and composition, the sum of the resistance of the second bonding wire BS and the resistance of the resistor RS can also be taken into account in a known manner in the above relationship for determining the load current IL from the measurement current IRS.

In a further embodiment, it is provided that, whilst dispensing with a separate resistor, the bonding wire BS forms the first resistor through which the measurement current flows and across which there is a voltage proportional to the load current. In order to satisfy the abovementioned condition wherein the resistance of the first resistor is greater than the resistance of the bonding wire BL in series with the semiconductor component, the diameter of the bonding wire BS is chosen to be smaller than that of the bonding wire BL or the bonding wire BS is chosen to be longer than the bonding wire BL.

This current IRS, which is proportional to the load current IL, can be detected through the use of evaluation circuits explained in more detail below and be used for providing a current measurement signal, in particular for providing a voltage referred to reference potential as current measurement signal.

If, in the circuit configuration illustrated in FIG. 2, the potential at the connecting terminal LF is greater than at the connecting terminal P1, then the current IL flows in the direction depicted in FIG. 2. In order to bring about a voltage drop URS across the first resistor RS which essentially corresponds to the voltage drop UBL across the connecting line, the connecting terminal P2 of the current measuring configuration MA1 must likewise be connected to a potential which is greater than the potential at the connecting terminal P1. In this case, the connecting terminal P2 is preferably connected to the connection LF, or the drain connection of the load transistor NTS.

If the potential at the connecting terminal P1 is greater than at the connecting terminal LF, then the transistor NTL is operated in the reverse direction and the connection P2 must be connected to a potential which is less than the potential at the connecting terminal P1, in order to bring about a voltage drop URS across the first resistor RS which corresponds to the voltage UBL across the connecting line BL. To that end, the connection P2 of the current measuring configuration MA1 can be connected to the drain connection D of the power transistor NTL in this case as well.

The functional principle of the current measuring configuration illustrated in FIG. 2, which is based on detecting the voltage drop across the bonding wire connected in series with the semiconductor component, is independent of the semiconductor component used. Instead of the transistor or a transistor with a parallel freewheeling diode, it is possible to use any other semiconductor component desired, for example a diode, which permits a current flow in one of the directions between the connections LF and Pi, the specific configuration of the current measuring configuration depending on the direction of the flowing current, as is explained below using various examples with current measuring configurations which are based on the functional principle described.

Consequently, the current measuring configuration illustrated in FIG. 2 can be used for determining a load current IL through a power semiconductor component, in particular a power transistor NTL, both when the transistor is used as a high-side switch and when the transistor is used as a low-side switch, independently of whether the power transistor is configured as an n-conducting transistor or as a p-conducting transistor. The current measuring configuration MA1 is also suitable for determining a current which flows through the power transistor NTL in the reverse direction.

Both the resistance of the resistor RS and the resistance of the bonding wire usually vary with temperature. In order largely to prevent this temperature dependence from affecting the measurement result, one embodiment of the invention provides for the resistor RS and the bonding wire to be provided such that they are spatially closely adjacent to one another, so that they are subject to the same temperature influences.

FIGS. 2 to 7 show exemplary embodiments of circuit configurations according to the invention in which n-conducting power transistors or p-conducting power transistors which are connected up as high-side switches or low-side switches are used as power semiconductor components. The circuit configurations each have a current measuring configuration MA1 which functions according to the first functional principle explained with reference to FIG. 2 and which is coordinated with the respective conduction type of the power transistor and the connections thereof, each of the current measuring configurations having a basic circuit in accordance with FIG. 2. The reference symbol NTL hereinafter designates an n-conducting power transistor and the reference symbol PTL designates a p-conducting power transistor. The reference symbols RS for the first resistor, OP1 for the operational amplifier, T1 for the variable resistor, K1, K2, P2 for the inputs of the current measuring configuration, P1, LF for the connections of the series circuit including power transistor NTL and connecting line BL and MA1 for the current measuring configuration are retained below, independently of whether further circuit components are present in the current measuring configuration MA1.

Figure 3:
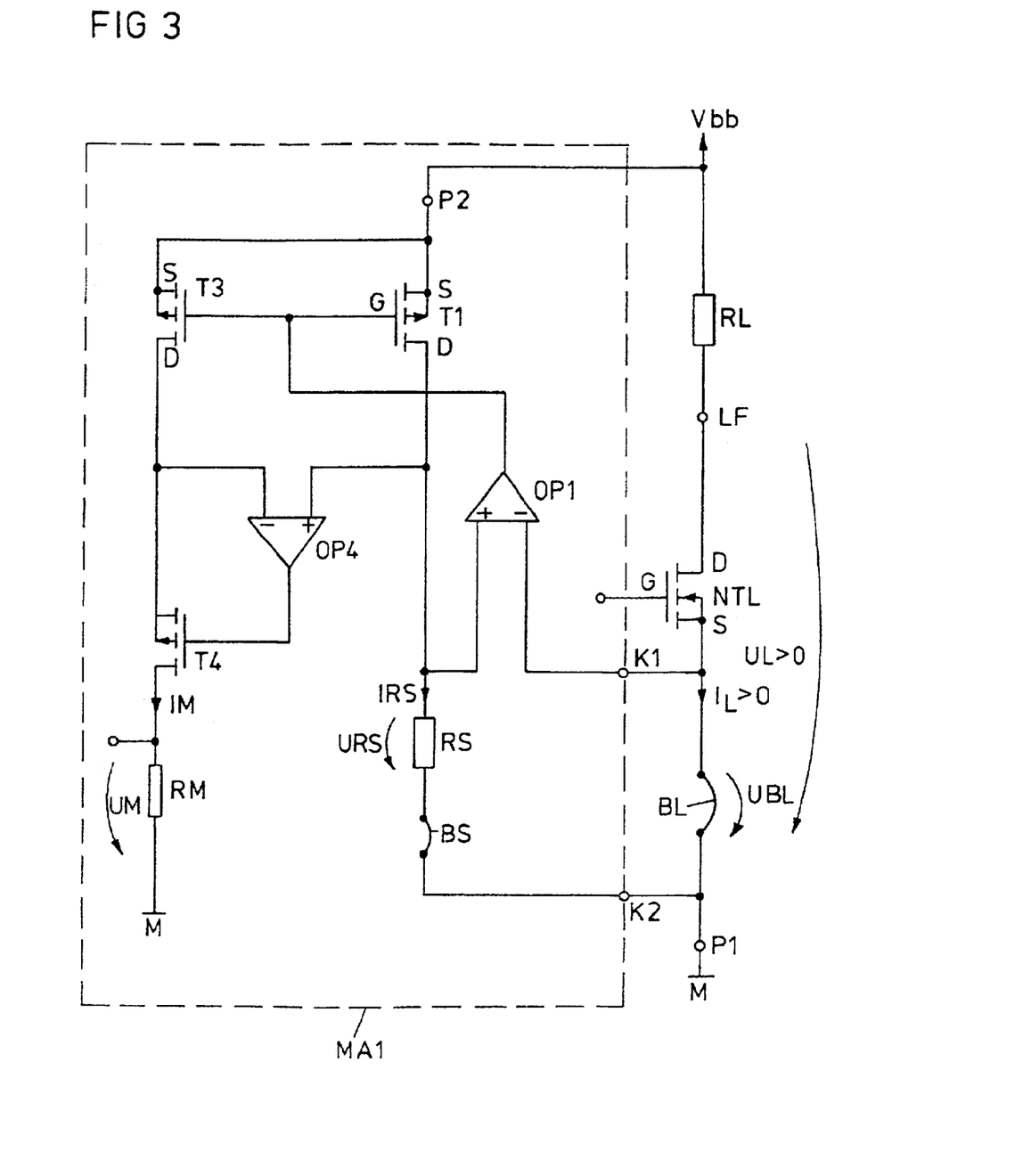
FIG. 3 is a circuit diagram of a circuit configuration having an n-channel field-effect transistor as a low-side switch and a current measuring configuration in accordance with the first functional principle which detects a current which is positive in the drain-source direction of the field-effect transistor.

FIG. 3 shows an exemplary embodiment of a circuit configuration according to the invention with an n-conducting field-effect transistor NTL as power transistor, which is connected in series with a load RL and the connecting line BL between a connecting terminal for a first supply potential Vbb and a reference potential M. The power transistor NTL acts as a low-side switch, i.e. the load RL is connected between the positive supply potential Vbb and the drain connection D of the power transistor NTL, or the connecting terminal LF. Furthermore, a load current IL flows through the power transistor in the direction depicted. This load current is positive with respect to the drain-source direction, that is to say the potential at the drain connection D, or the connecting terminal LF, is greater than at the source connection S.

The second connecting terminal P1 of the series circuit including power transistor NTL and connecting line BL is connected to the reference potential M. In addition to the series circuit—already explained above—including the first resistor RS and the variable resistor—configured as transistor T1—and the operational amplifier OP1, the current measuring configuration MA1 has a current mirror configuration which maps a current IRS flowing through the first resistor RS onto a measurement current IM, the measurement current IM bringing about a voltage drop UM relative to reference potential M across a current measuring resistor RM. The transistor T1 serving as variable resistor is configured as a p-channel transistor whose resistance is set through the use of the operational amplifier OP1 in such a way that the voltage drop URS across the first resistor RS approximately corresponds to the voltage drop UBL across the connecting line BL. The third input P2 of the current measuring configuration MA1 is connected to the positive supply potential Vbb in order to bring about a voltage drop URS across the first resistor RS corresponding to the voltage drop UBL across the connecting line BL.

The current mirror configuration has a transistor T3, whose source connection S is connected to the source connection S of the transistor T1, whose gate connection G is connected to the gate connection of the transistor T1. Connected downstream of the transistor T3 is a further transistor T4, which is likewise configured as a p-channel transistor and which is driven by an operational amplifier OP4, whose noninverting input is connected to the drain connection D of the transistor T1 and whose inverting input is connected to the drain connection of the transistor T3. The on resistance of the transistor T4 is set through the use of the operational amplifier OP4 in such a way that the drain potentials of the transistors T1, T3 match, so that the two transistors T1, T3 are operated at the same operating point. Given identical transistors T1, T3, a current IM flowing through the transistor T3 corresponds to the current IRS through the first resistor RS. If the transistors T1, T3 differ in their active transistor areas—but they are otherwise constructed identically—then the current IM is proportional to the current IRS, the proportionality factor corresponding to the ratio of the active transistor areas between the transistor T3 and the transistor T1. The following then holds true for the voltage UM which can be tapped off relative to reference potential M and represents a current measurement signal:

$$UM = RM \cdot IM = RM \cdot IRS = RM \cdot (RBL/RS) \cdot IL,$$

if IRS=IM holds true. If the transistors T1 and T3 have different active transistor areas, an additional proportionality factor must be taken into account in a known manner.

Consequently, the circuit configuration according to the invention as shown in FIG. 3 makes it possible to provide a current measurement signal dependent on the load current IL in the case of a power transistor NTL used as a low-side switch by evaluation of the voltage UBL present across the bonding wire BL, without a negative auxiliary voltage being required.

Figure 4:
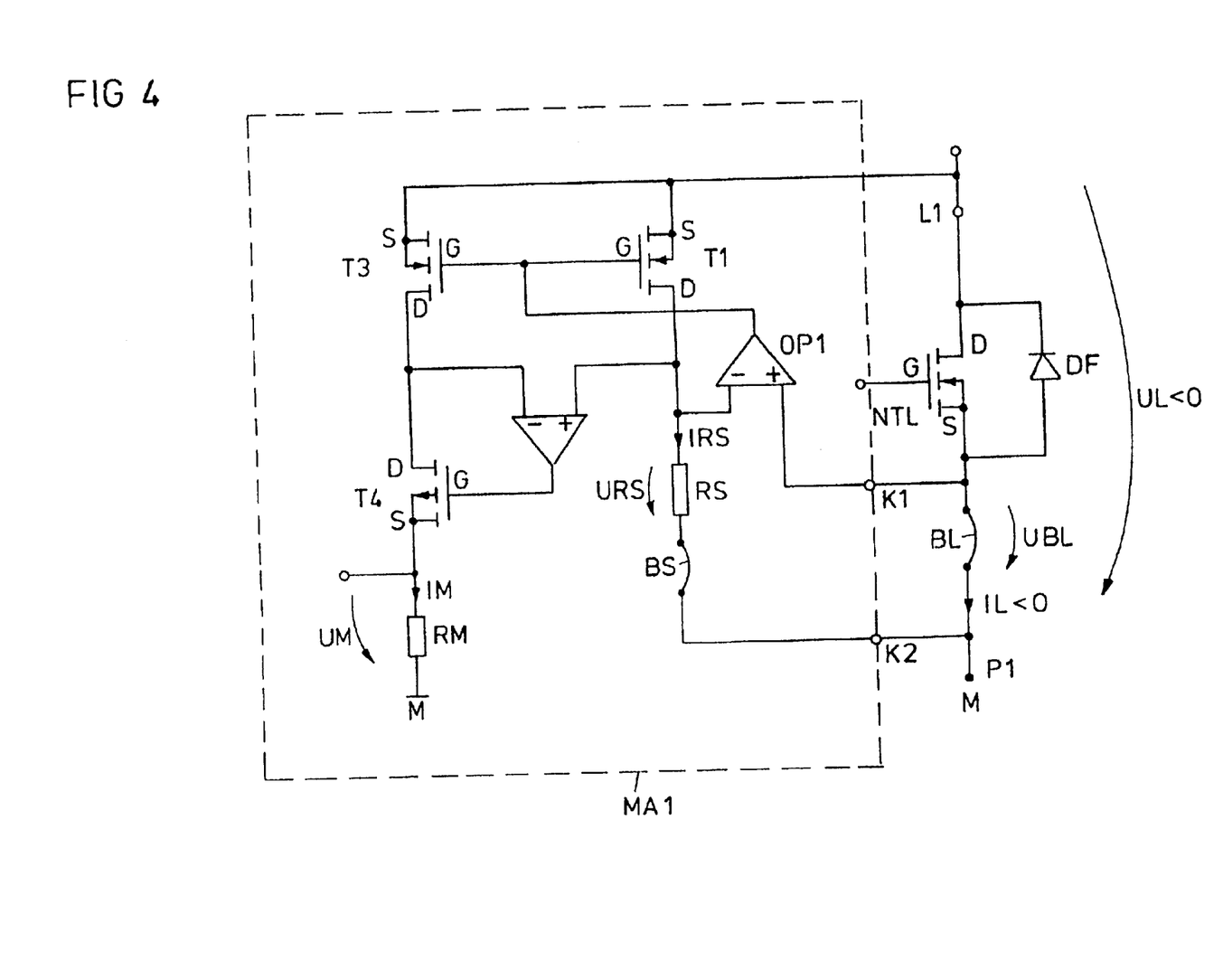
FIG. 4 is a circuit diagram of a circuit configuration according to the invention having an n-channel field-effect transistor and a current measuring configuration in accordance with the first functional principle which detects a current which is negative in the drain-source direction of the field-effect transistor.

FIG. 4 shows a further exemplary embodiment of a circuit configuration according to the invention, in which an n-conducting field-effect transistor used as a switch is connected, in a manner not specifically illustrated, to a voltage source and a load in such a way that a negative voltage UL is present between the connecting terminal LF and the connecting terminal P1. Consequently, a potential which is less than the potential at the connection P1 is present at the drain connection D of the power transistor NTL, so that the load current IL illustrated in FIG. 4 is likewise negative relative to the drain-source direction, that is to say flows counter to the direction depicted. The construction of the current measuring configuration MA1 corresponds to the construction of the current measuring configuration MA1 described in FIG. 3, the transistor T1 used as a variable resistor and the associated current mirror transistor T3 and the transistor T4 being configured as n-channel transistors. A measurement current IM flows through the measuring resistor RM, which measurement current is dependent on the load current IL in the manner explained above, the measurement current IM also being negative in the exemplary embodiment in accordance with FIG. 4. In order to provide a measurement current IM which is positive relative to reference potential M, it is possible to provide a further current mirror configuration in a generally known manner.

The third connecting terminal L1 of the current measuring configuration MA1 in accordance with FIG. 4, to which the source connections of the transistors T1, T3 are connected, is connected to the drain connection D of the power transistor NTL in order to put the source connections S of the transistors T1, T3 at the negative supply potential brought about by the load R, L.

If a positive or a negative load current through the power transistor is brought about by a load in a manner dependent on the operating state thereof, then it is possible, in a manner not specifically illustrated, for the current measuring configurations according to FIGS. 2 and 3 simultaneously to be connected to the transistor and the connecting line in the manner described in these figures, in order to be able to detect both positive and negative load currents.

Thus, a circuit configuration combined through the circuit configurations in accordance with FIGS. 3 and 4 can be used for example as an "intelligent connecting terminal" of a vehicle battery, that, depending on whether the battery is connected to a load for the purpose of outputting current or to a charging circuit for the purpose of taking up current, accordingly has a positive or negative current flowing through it.

Load currents with alternating directions can occur for example when inductive loads are driven through the use of a transistor and a freewheeling diode in parallel with the transistor. In applications of this type, a load current flows through the inductive load when the transistor is in the on state, in which case, after the transistor turns off, the freewheeling diode accepts a current which is induced by the inductive load and flows in the opposite direction to the load current. Load currents with alternating directions can also occur for example in switches which are configured to connect a load to voltages with a variable sign. Such a switch may serve for example for connecting a battery, in particular a vehicle battery, either to a load, which draws current form the battery, or to a charging unit, which feeds current to the battery, in which case the current respectively flowing is to be determined.

Figure 5:
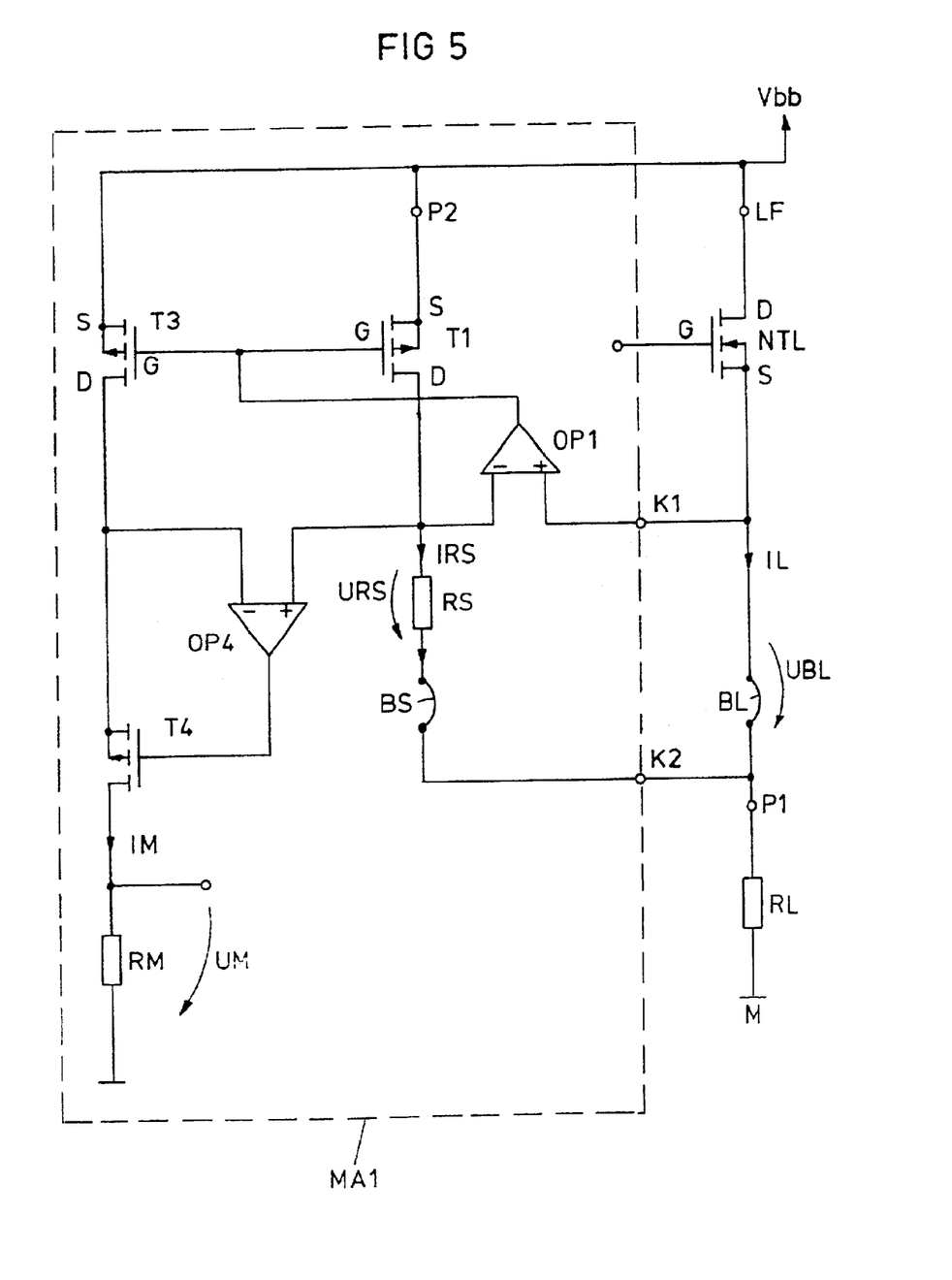
FIG. 5 is a circuit diagram of a circuit configuration according to the invention having an n-channel field-effect transistor as a high-side switch and a current measuring configuration in accordance with the first functional principle which detects a current which is positive in the drain-source direction of the field-effect transistor.

FIG. 5 shows a further exemplary embodiment of a circuit configuration according to the invention with a power switch which is configured as an n-conducting field-effect transistor NTL and is used as a high-side switch, the drain connection D of the power transistor NTL being connected to the positive supply potential Vbb and a load RL being connected in series with the connecting line BL between the second connection PI and reference potential M.

The construction and the method of operation of the current measuring configuration MA1 in accordance with FIG. 5 corresponds to the construction and the method of operation of the current measuring configuration in accordance with FIG. 3, the source connections of the p-channel transistors T1, T3 being connected to the positive supply potential Vbb via the third connecting terminal P2 of the current measuring configuration MA1.

Figure 6:
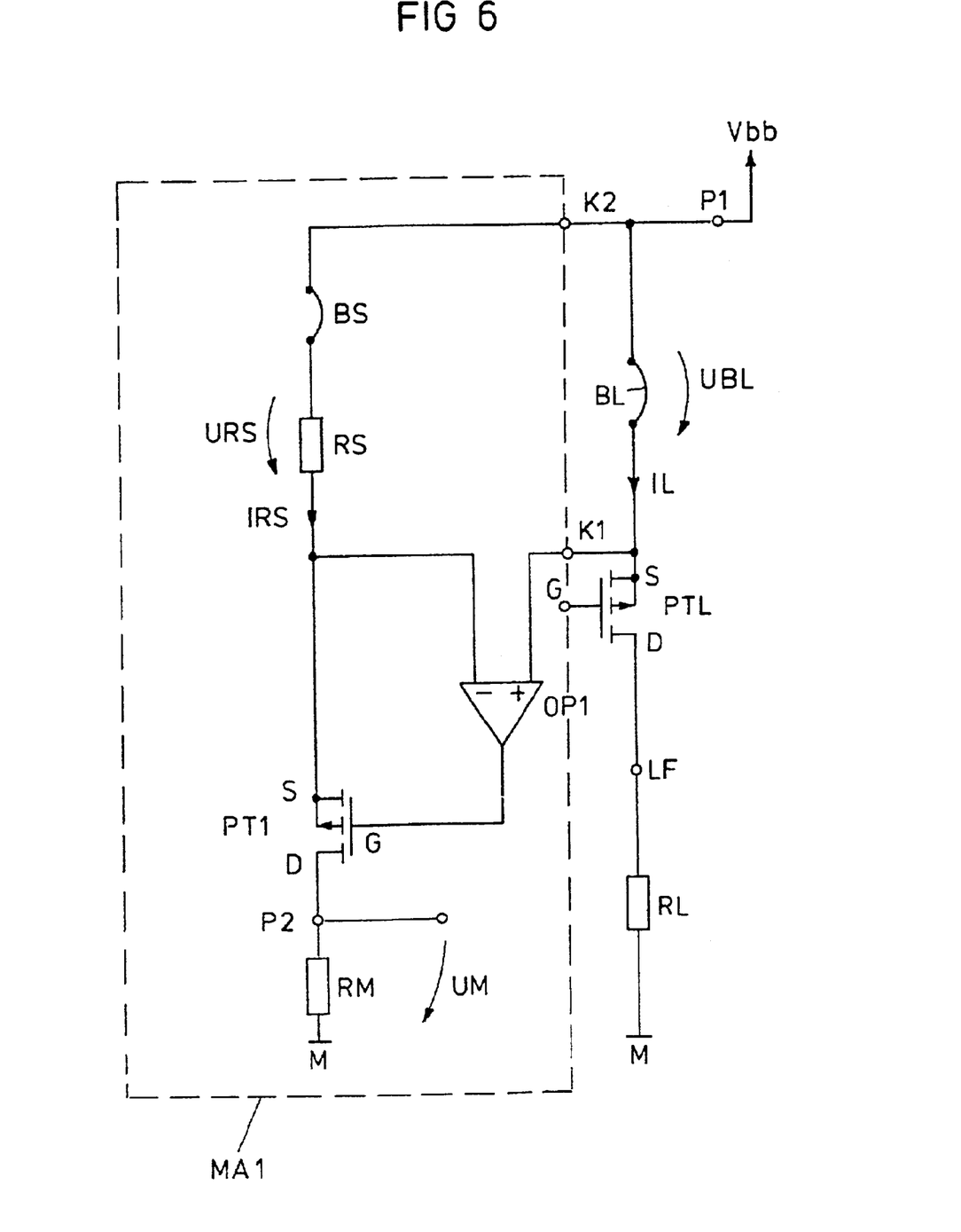
FIG. 6 is a circuit diagram of a circuit configuration according to the invention having a p-channel field-effect transistor as a high-side switch and a current measuring configuration in accordance with the first functional principle which detects a current which is positive in the source-drain direction of the field-effect transistor.

FIG. 6 shows a further exemplary embodiment of a circuit configuration according to the invention, in this circuit configuration a p-conducting field-effect transistor PTL being used as a power switch, which serves as a high-side switch in the exemplary embodiment in accordance with FIG. 6. The source connection S of the transistor PTL is connected to the positive supply potential Vbb via the connecting line BL and the second connection terminal P1. The load RL is connected to the drain connection D or the first connection LF, which usually corresponds to the lead frame of a housing, the other connecting terminal of the load being connected to reference potential M.

The variable resistor T1 connected in series with the first resistor RS is configured as a p-conducting field-effect transistor whose source connection S is connected to the first resistor RS and whose drain connection is connected to the third connecting terminal P2 of the current measuring configuration MA1. A current measuring resistor RM is connected between the third connecting terminal P3 and reference potential M, across which resistor a current measurement signal UM can be tapped off which is proportional to the current IRS through the first resistor RS, or proportional to the load current IL. The voltage UBL across the connecting line BL and thus the voltage URS across the first resistor RS are positive in the exemplary embodiment in accordance with FIG. 6 and the load current IL and, respectively, the current IRS through the first resistor RS are likewise positive.

Figure 7:
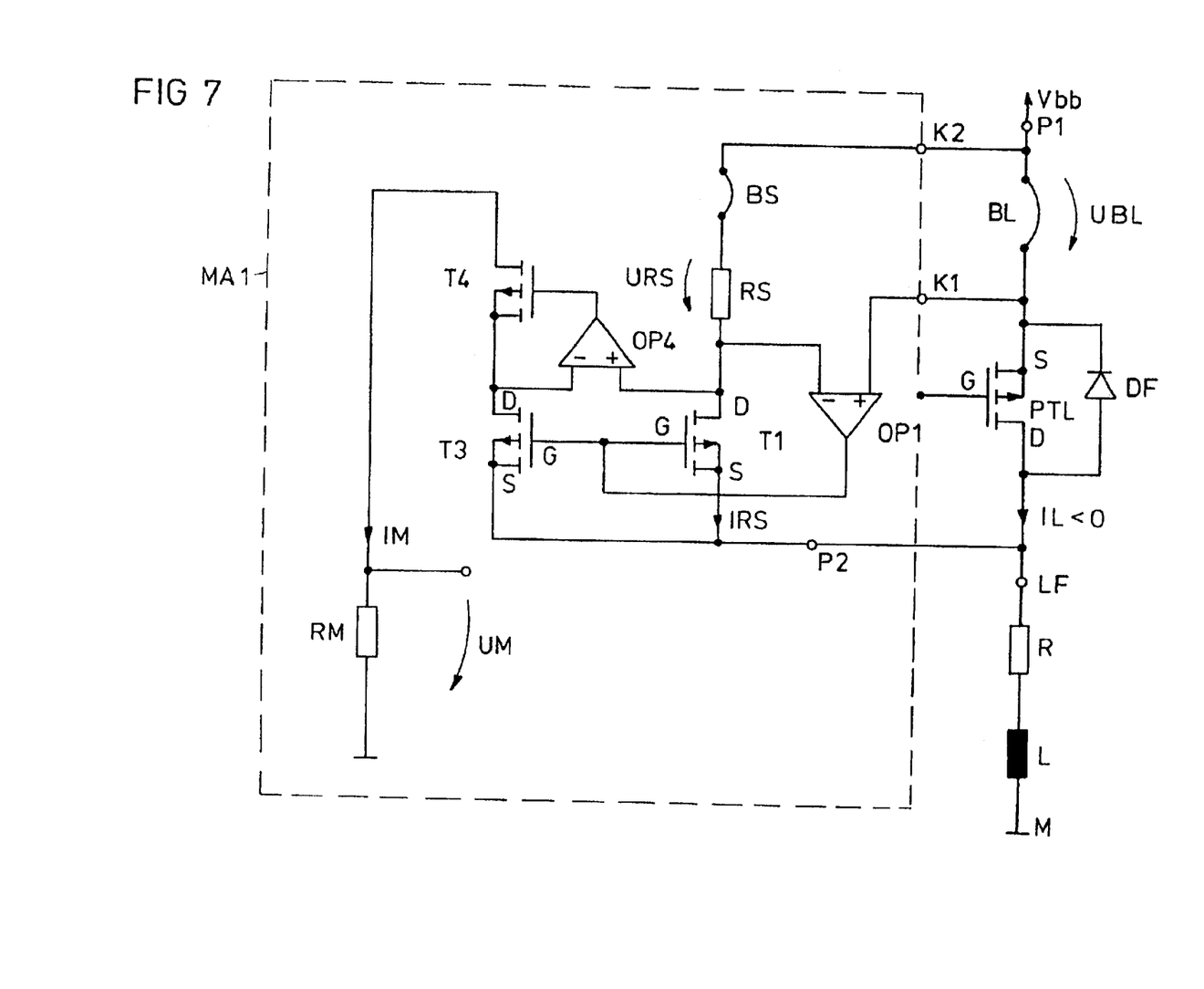
FIG. 7 is a circuit diagram of a circuit configuration according to the invention having a p-channel field-effect transistor as a high-side switch and a current measuring configuration in accordance with the first functional principle which detects a current which is negative in the source-drain direction of the field-effect transistor.

FIG. 7 shows a circuit configuration according to the invention with a p-conducting field-effect transistor as a power switch, which serves as a high-side switch in the exemplary embodiment, it being assumed in the exemplary embodiment that the load connected between the first connecting terminal LF and reference potential brings about, at the first connecting terminal LF, a potential which is greater than the positive supply potential Vbb to which the first connecting terminal Pi of the series circuit including power transistor and connecting line BL is connected.

The second connecting terminal P2 of the current measuring configuration MA1 is connected to the drain connection of the power transistor in the exemplary embodiment. The load current IL flows counter to the direction depicted in FIG. 7, in which case, with the transistor PTL being driven, the load current flows via the source-drain path of the power transistor PTL and otherwise via the freewheeling diode DF. The current through the first resistor RS likewise flows counter to the direction depicted in FIG. 7, the first transistor T1, which serves as a variable resistor, being configured as a p-conducting transistor whose drain connection D is connected to the first resistor RS and whose source connection S is connected to the third connecting terminal P3 of the current measuring configuration. A current mirror configuration having a transistor T3, a transistor T4 serving as a variable resistor, and an operational amplifier OP4 maps this negative current IRS through the first resistor RS onto a measurement current IM which is positive relative to reference potential M. To that end, the gate connection of the third transistor T3 is connected to the gate connection of the first transistor T1, and the source connection of the transistor T3 is connected to the source connection of the first transistor T1. The transistor T4 is driven by an operational amplifier OP4, whose noninverting input is connected to the drain connection of the transistor T1 and whose inverting input is connected to the drain connection D of the transistor T3. The transistor T4 sets the drain potential of the transistor T3 in such a way that this drain potential matches the drain potential of the transistor T1, so that the transistors T1 and T3 are operated at the same operating point, so that the measurement current IM corresponds to the magnitude of the current IRS through the first resistor RS, or that the measurement current IM is related to the current IRS through the first resistor RS or the load current IL by way of the area ratio of the two transistors T1, T3.

Figure 8:
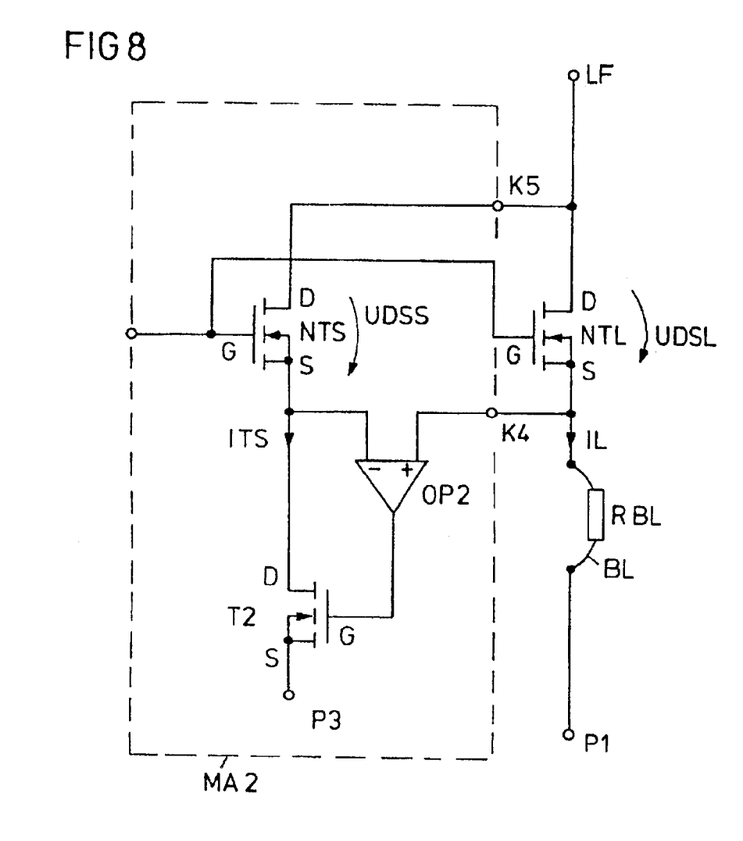
FIG. 8 is a circuit diagram of a circuit configuration according to the invention having a power switch, a connecting line connected in series with the power switch, and a current measuring configuration in accordance with a second functional principle.

FIG. 8 shows a circuit configuration with a power semiconductor component as power transistor. The power transistor being connected in series with a connecting line BL and a current measuring configuration MA2 being provided, which functions in accordance with a second functional principle. As in the exemplary embodiments described above, the drain-source path of the transistor TL is connected in series with a connecting line BL, the series circuit being connected up between a first terminal LF, to which the drain connection D of the power transistor NTL is connected, and a second terminal P2, to which a connection of the connecting line BL is connected.

The current measuring configuration MA2 has a measuring transistor NTS, which is of the same conduction type as the power transistor NTL, the drain connection D of the measuring transistor NTS being connected to the drain connection D of the power transistor NTL via a connecting terminal KS of the current measuring configuration MA2. The gate connection G of the measuring transistor NTS is connected to the gate connection of the load transistor NTL.

The power transistor NTL and the measuring transistor NTS are preferably integrated in a common semiconductor body. This capitalizes on the fact that power transistors usually include a multiplicity of identically constructed transistor cells, one or a number of these transistor cells whose source connections are not connected to the source connections of the remaining transistor cells being utilized in the measuring transistor NTS.

The current measuring configuration MA2 furthermore has a variable resistor which, in the exemplary embodiment, is configured as a transistor T2 and is connected in series with the measuring transistor NTS. This transistor T2 is driven by an operational amplifier OP2, whose noninverting input is connected to the source connection S of the power transistor NTL via a connecting terminal K4 and whose inverting input is connected to a node common to the current measuring transistor NTS and the variable resistor T2. The operational amplifier OP2 sets the on resistance of the transistor T2 in such a way that the source potentials of the load transistor NTL and of the measuring transistor NTS match. These two transistors are then operated at the same operating point, the drain-source voltage UDSL of the power transistor NTL corresponding to the drain-source voltage UDSS of the measuring transistor NTS. A source current ITS flowing through the measuring transistor NTS is then proportional to a load current IL flowing through the power transistor NTL, the proportionality factor corresponding to the ratio between the active transistor area of the load transistor NTL and the active transistor area of the power transistor NTS.

The functional principle of the measuring configuration MA2 is based on operating the measuring transistor NTS at the same operating point as the load transistor, the voltage drop across the bonding wire BL serving for setting the source potential of the measuring transistor NTS.

Figure 9:
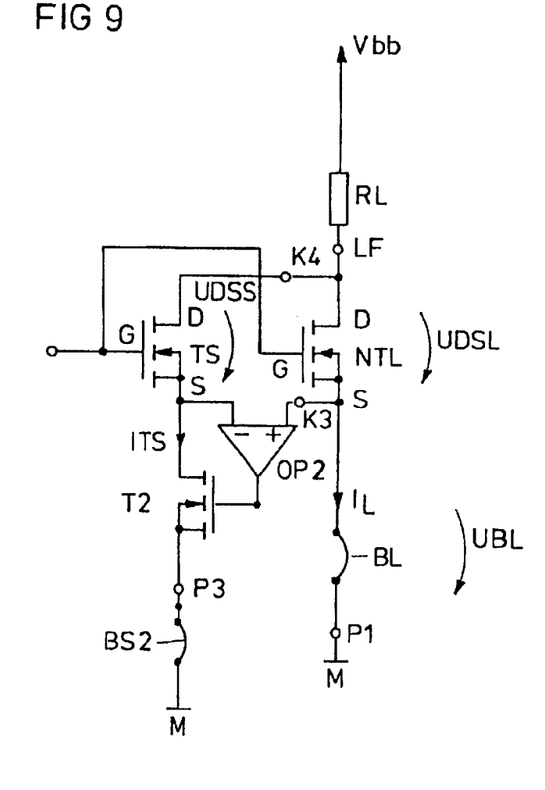
FIG. 9 is a circuit diagram of a circuit configuration according to the invention having an n-channel field-effect transistor as a low-side switch and a current measuring configuration in accordance with the second functional principle which collects a current which is positive in the drain-source direction of the field-effect transistor.

FIG. 9 shows a circuit configuration with an n-conducting power transistor NTL serving as a low-side switch, the drain connection of the power transistor NTL being connected to a load RL and that connection of the load RL which is remote from the power transistor NTL being connected to the positive supply potential Vbb. The second connection P1 of the series circuit including load, power transistor NTL and connecting line BL is connected to reference potential M. In the exemplary embodiment, the transistor T2, which serves as a variable resistor and is driven by the operational amplifier OP2, is configured as an n-conducting transistor whose drain connection D is connected to the source connection S of the measuring transistor NTS and whose source connection is connected to the third connecting terminal P3 of the current measuring configuration MA2. In the exemplary embodiment, the third connecting terminal P3 is connected to reference potential M via a second connecting line BS2, in particular a bonding wire. The configuration including operational amplifier OP2 and transistor T2 sets the source potential S of the measuring transistor NTS in such a way that it corresponds to the source potential of the power transistor NTL. The source current ITS flowing through the measuring transistor is then proportional to the load current IL. The measurement current ITS is usually significantly smaller than the load current IL, so that the voltage UBS2 dropped across the second connecting line BS2 is significantly less than the voltage UBL across the connecting line BL. The difference formed from the voltage UBL and the voltage UBS2 is obtained as drain-source voltage of the transistor T2 and serves for setting the source potential of the measuring transistor NTS to the source potential of the transistor NTL. The measurement current ITS can be tapped off through the use of a current mirror configuration, which is not explicitly illustrated in FIG. 9 but is generally known to a person skilled in the art, and can be converted into a voltage referred to reference potential M, which voltage serves as current measurement signal, as is explained using the two exemplary embodiments below in FIGS. 11 and 12.

Figure 10:
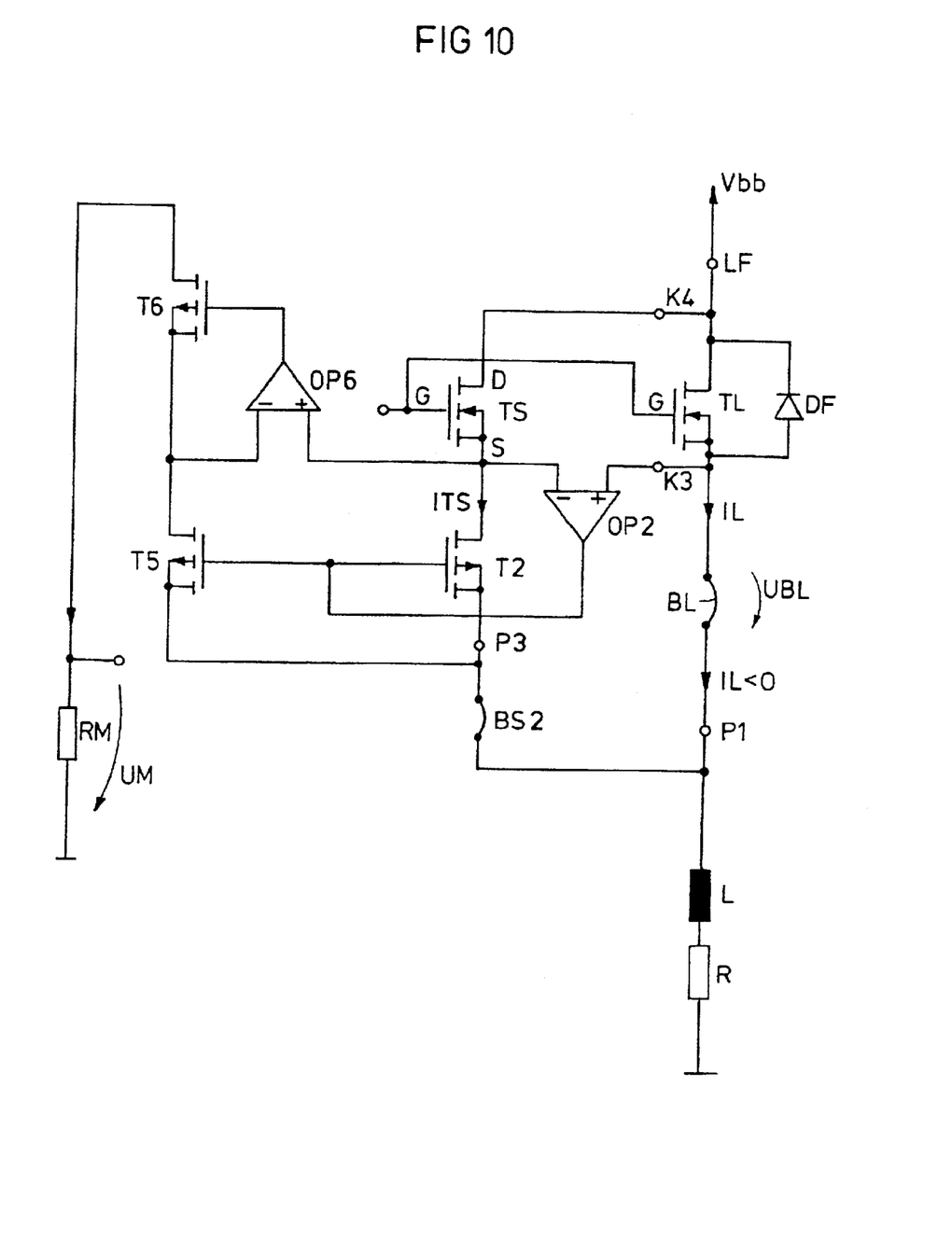
FIG. 10 is a circuit diagram of a circuit configuration according to the invention having an n-channel field-effect transistor as a high-side switch and a current measuring configuration in accordance with the second functional principle which detects a current which is negative in the drain-source direction of the field-effect transistor.

FIG. 10 shows a further exemplary embodiment of a circuit configuration according to the invention, in which an n-conducting field-effect transistor TL serves as a high-side switch. The drain connection D of the field-effect transistor is connected to the first connection LF or to the positive supply potential Vbb. The second connection Pi of the series circuit including power transistor TL and connecting line BL is connected to a load R, L, whose connection remote from the connecting line BL is connected to reference potential M. In the exemplary embodiment, the third connecting terminal P3 of the current measuring configuration MA2 is connected via a second connecting line BS2 to the second connecting terminal P1, which is, for example, a connecting pin of a housing in which the power transistor TL and the current measuring configuration MA2 are integrated. In this case, the power transistor TL and the current measuring configuration MA2 are usually integrated in a common semiconductor body.

In the exemplary embodiment, the transistor T2, which serves as a variable resistor and is connected in series with the measuring transistor TS, is configured as a p-conducting field-effect transistor whose drain connection is connected to the source connection S of the measuring transistor TS and whose source connection is connected to the third connecting terminal P3.

A current mirror configuration having a transistor T5, a transistor T6 and an operational amplifier OHM serves for converting the measurement current ITS through the measuring transistor TS into a measurement current IM which is positive relative to reference potential M. The current mirror configuration has a p-conducting transistor T5, whose gate is connected to the gate of the transistor T2 and whose source is connected to the source of the transistor T2. A transistor T6 is connected in series with the transistor T5 and is driven by an operational amplifier OHM, the operational amplifier OHM driving the transistor T6 in such a way that the source potential of the transistor T5 corresponds to the source potential of the transistor T2. The transistors T2, TS are then operated at the same operating point, the measurement current IM being related to the measurement current ITS through the measuring transistor TS by way of the area ratio of the two transistors T2, T5. The current measuring configuration in accordance with FIG. 10 is configured to detect a negative load current IL, i.e. a load current which flows counter to the direction depicted in FIG. 10. Such a load current is produced if the potential at the connecting terminal P1 is greater than the supply potential vbb at the connecting terminal LF.

Figure 11:
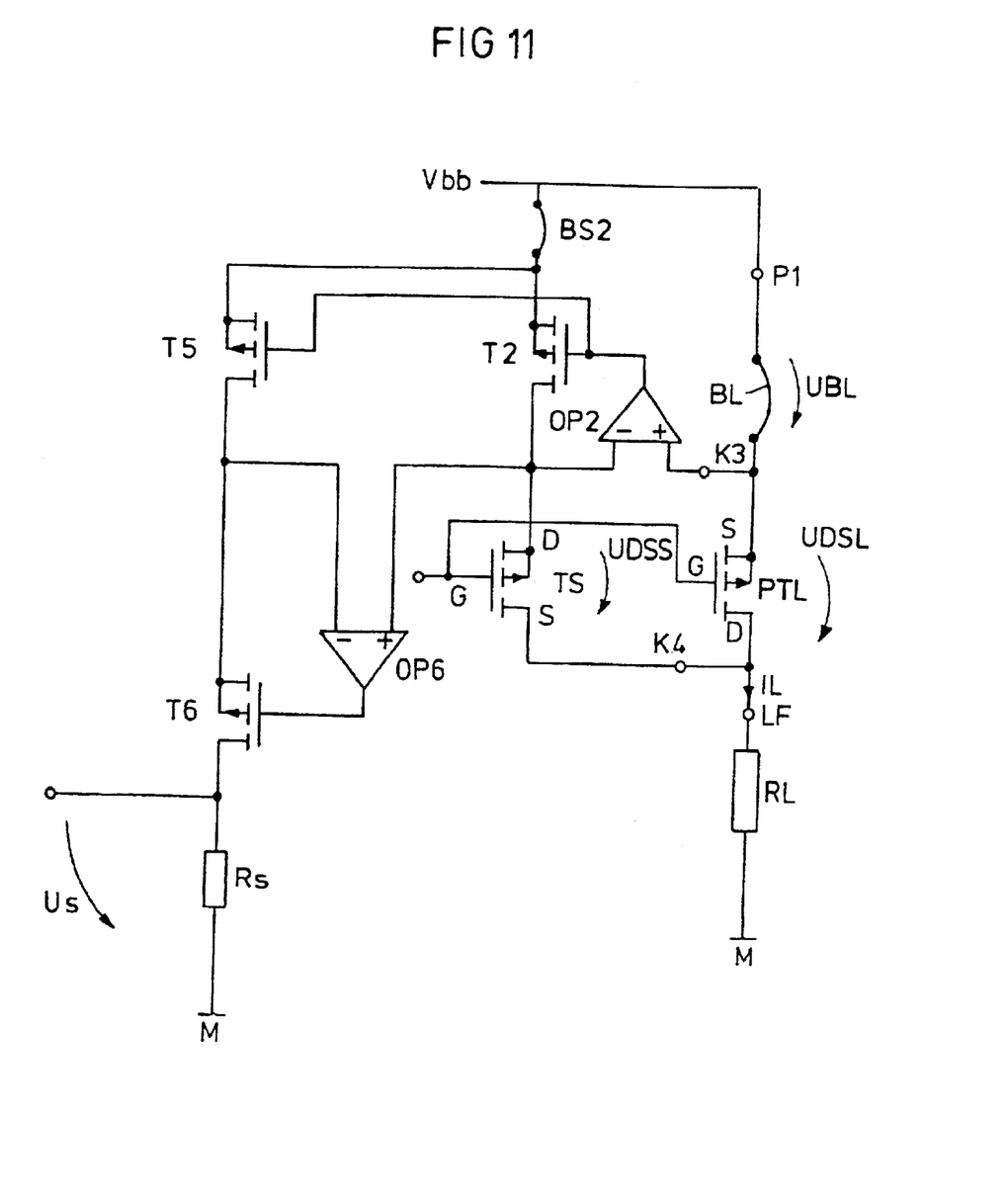
FIG. 11 is a circuit diagram of a circuit configuration according to the invention having a p-channel field-effect transistor as a high-side switch and a current measuring configuration in accordance with the second functional principle which detects a current which is positive in the source-drain direction of the field-effect transistor.

FIG. 11 shows an exemplary embodiment of a circuit configuration with a p-conducting transistor, which is used as a high-side switch. The source connection S of the transistor PTL is connected to the positive supply potential Vbb via the connecting line BL. The load RL is connected between the drain connection D of the power transistor PTL and reference potential M. The third connecting terminal P3 of the current measuring configuration MA2 is connected to the positive supply potential Vbb via the second connecting line BS2. In the exemplary embodiment, the transistor T2 serving as a variable resistor is configured as a p-channel transistor whose source connection is connected to supply potential Vbb via the connecting line BS2 and whose drain connection D is connected to the drain connection D of the measuring transistor TS, which is likewise configured as a p-conducting transistor. If a potential which is greater than the potential at the connecting terminal LF is present at the connecting terminal P1, then a load current IL flows through the power transistor PTL, which load current flows in the direction depicted in FIG. 11. The measuring transistor TS is operated at the same operating point as the load transistor PTL and the measurement current flowing through the measuring transistor TS flows in the direction depicted in FIG. 11. A current mirror configuration having a transistor T5, a transistor T6 and an operational amplifier OP6 converts the measurement current ITS into a measurement current IM which is positive relative to reference potential M and brings about a positive voltage drop UM relative to reference potential M in a measuring resistor RM connected downstream of the transistors T5, T6, the voltage drop UM being proportional to the measurement current ITS through the transistor TS, or proportional to the load current IL.

The concept underlying the circuit configurations according to the invention is based on detecting the voltage drop UBL brought about by a load current on a connecting line, usually a bonding wire, either through the use of a measuring resistor in a current measuring configuration, and providing a suitable current measurement signal, or using the voltage drop across the connecting line to set a measuring transistor to the same operating point as the load transistor. Further external supply potentials are not necessary for this purpose.

I claim:

1. A circuit configuration, comprising:
   a power semiconductor component having load connections including a first load connection and a second load connection;
   a connecting line connected between one of said load connections and one of a load and a terminal for a supply potential, said connecting line having a given resistance;
   said connecting line defining a first node and a second node, said first node being common to one of said load connections and said connecting line, said second node being remote from said power semiconductor component;
   a measuring configuration having a first terminal and a second terminal as input terminals, said first terminal of said measuring configuration being connected to said first node, said second terminal of said measuring configuration being connected to said second node of said connecting line;
   said measuring configuration further having a series circuit including a first resistor and a second resistor, said first resistor having a resistance, said given resistance of said connecting line and said resistance of said first resistor having a given ratio, said second resistor being a variable resistor;
   said terminal for a supply potential supplying a first supply potential; and
   said series circuit connected between a second supply potential and said second terminal of said measuring configuration.

2. The circuit configuration according to claim 1, wherein:
   said measuring configuration has a third terminal for receiving a second supply potential.

3. A circuit configuration, comprising:
   a power semiconductor component having load connections including a first load connection and a second load connection;
   a connecting line connected between one of said load connections and one of a load and a terminal for a supply potential;
   said connecting line defining a first node and a second node, said first node being common to one of said load connections and said connecting line, said second node being remote from said power semiconductor component; and
   a measuring configuration having a first terminal and a second terminal as input terminals, said first terminal of said measuring configuration being connected to said first node, said second terminal of said measuring configuration being connected to said second node of said connecting line; said measuring configuration further having a series circuit including a first resistor and a second resistor; and
   said second resistor is a variable resistor with a resistance set in dependence of a potential difference between said first terminal of said measuring configuration and a node common to said first resistor and said second resistor.

4. A circuit configuration, comprising:
   a power semiconductor component having load connections including a first load connection and a second load connection;
   a connecting line connected between one of said load connections and one of a load and a terminal for a supply potential;

said connecting line defining a first node and a second node, said first node being common to one of said load connections and said connecting line, said second node being remote from said power semiconductor component;

a measuring configuration having a first terminal and a second terminal as input terminals, said first terminal of said measuring configuration being connected to said first node, said second terminal of said measuring configuration being connected to said second node of said connecting line;

said measuring configuration further having a series circuit including a first resistor and a second resistor;

said connecting line is a first connecting line; and a second connecting line is connected in series with said first resistor, said second connecting line having a resistance less than a resistance of said first resistor.

5. A circuit configuration, comprising:

a power semiconductor component having load connections including a first load connection and a second load connection;

a connecting line connected between one of said load connections and one of a load and a terminal for a supply potential;

said connecting line defining a first node and a second node, said first node being common to one of said load connections and said connecting line, said second node being remote from said power semiconductor component;

a measuring configuration having a first terminal and a second terminal as input terminals, said first terminal of said measuring configuration being connected to said first node, said second terminal of said measuring configuration being connected to said second node of said connecting line;

said measuring configuration further having a series circuit including a first resistor and a second resistor; and said second resistor is a variable resistor configured as a transistor.

6. The circuit configuration according to claim 5, including:

an operational amplifier having a first input, a second input and an output, said first input being connected to said first terminal of said measuring configuration, said second input being connected to a node common to said first resistor and said second resistor; and said second resistor having a control connection, said output of said operational amplifier being connected to said control connection of said second resistor.

7. A circuit configuration, comprising:

a power semiconductor component having load connections including a first load connection and a second load connection;

a connecting line connected between one of said load connections and one of a load and a terminal for a supply potential;

said connecting line defining a first node and a second node, said first node being common to one of said load connections and said connecting line, said second node being remote from said power semiconductor component;

a measuring configuration having a first terminal and a second terminal as input terminals, said first terminal of said measuring configuration being connected to said first node, said second terminal of said measuring configuration being connected to said second node of said connecting line;

said measuring configuration further having a series circuit including a first resistor and a second resistor and a current mirror configuration which provides a current measurement signal dependent on a current through said first resistor.

8. The circuit configuration according to claim 6, wherein said current mirror configuration provides the current measurement signal with reference to a reference potential.

9. The circuit configuration according to claim 1, wherein said power semiconductor component is a diode.

10. The circuit configuration according to claim 1, wherein said power semiconductor component is a power transistor with a diode connected in parallel thereto.

* * * * *